(12) United States Patent
Keck et al.

(10) Patent No.: US 11,428,880 B2
(45) Date of Patent: Aug. 30, 2022

(54) OPTICAL BASED PLACEMENT OF AN OPTICAL COMPONTENT USING A PICK AND PLACE MACHINE

(71) Applicant: OpenLight Photonics, Inc., Goleta, CA (US)

(72) Inventors: Steven William Keck, Mountain View, CA (US); Roberto Marcoccia, San Jose, CA (US); Steve McGowan, San Jose, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 114 days.

(21) Appl. No.: 16/945,340

(22) Filed: Jul. 31, 2020

(65) Prior Publication Data

US 2022/0035110 A1 Feb. 3, 2022

(51) Int. Cl.
*H04B 10/00* (2013.01)
*G02B 6/42* (2006.01)
*G02B 27/62* (2006.01)

(52) U.S. Cl.
CPC ......... *G02B 6/4227* (2013.01); *G02B 6/4225* (2013.01); *G02B 6/4239* (2013.01); *G02B 27/62* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,329,659 A | * | 5/1982 | Chen | H01S 5/0683 385/88 |
| 4,653,905 A | * | 3/1987 | Farrar | G01C 3/00 396/106 |
| 4,722,587 A | * | 2/1988 | Thorsten | G02B 6/4292 385/115 |
| 4,808,816 A | * | 2/1989 | Flickinger | G01R 31/2656 250/227.3 |

(Continued)

FOREIGN PATENT DOCUMENTS

| | | |
|---|---|---|
| CN | 114056884 | 2/2022 |
| EP | 0545584 | 6/1993 |
| GB | 2239091 | 6/1991 |

OTHER PUBLICATIONS

"European Application Serial No. 21181859.6, Extended European Search Report dated Dec. 14, 2021", 7 pgs.

*Primary Examiner* — Agustin Bello
(74) *Attorney, Agent, or Firm* — Schwegman Lundberg & Woessner, P.A.

(57) ABSTRACT

An optical pick and place machine that includes a self-calibrating optical controller for error feedback based optical placement of optical components using active alignment is described. The optical controller can include a loopback mode to generate a baseline value of light generated by a light source and measured by a photodetector within the optical controller. The optical controller can further include an active alignment mode in which the light is coupled from the pick and place machine to the optical device on which the component is placed. The optical coupling of the placed component can be evaluated against the baseline value to ensure that the optical coupling is within specification (e.g., within a prespecified range).

20 Claims, 8 Drawing Sheets

(56) References Cited

U.S. PATENT DOCUMENTS

| | | | | |
|---|---|---|---|---|
| 4,892,374 A * | 1/1990 | Ackerman | ............ | G02B 6/4225 372/75 |
| 5,029,965 A * | 7/1991 | Tan | ............ | G02B 6/4227 385/90 |
| 5,217,906 A * | 6/1993 | Abbott | ............ | G02B 6/4222 385/94 |
| 5,666,450 A * | 9/1997 | Fujimura | ............ | G02B 6/30 385/91 |
| 5,916,458 A * | 6/1999 | Komoriya | ............ | G02B 6/4227 356/400 |
| 6,325,551 B1 * | 12/2001 | Williamson, III | ... | G02B 6/4219 385/91 |
| 6,389,688 B1 * | 5/2002 | Srivastava | ............ | H01L 21/681 29/740 |
| 6,748,141 B2 * | 6/2004 | Kennedy | ............ | G02B 6/30 700/192 |
| 6,886,997 B2 * | 5/2005 | Cheung | ............ | G02B 6/4225 385/91 |
| 7,068,891 B1 * | 6/2006 | Cook | ............ | G02B 6/4227 385/52 |
| 7,371,017 B1 * | 5/2008 | Shi | ............ | G02B 6/4226 385/35 |
| 2002/0131729 A1 * | 9/2002 | Higgins, III | ............ | G02B 6/4226 385/91 |
| 2004/0207836 A1 * | 10/2004 | Chhibber | ............ | G01N 21/8806 356/237.4 |
| 2005/0046974 A1 * | 3/2005 | Hu | ............ | G02B 6/4221 359/819 |
| 2005/0235489 A1 * | 10/2005 | Okuda | ............ | H05K 13/0812 29/832 |
| 2007/0003126 A1 * | 1/2007 | Case | ............ | H05K 13/0812 700/95 |
| 2007/0229851 A1 * | 10/2007 | Horijon | ............ | H01L 21/681 356/615 |
| 2008/0259353 A1 * | 10/2008 | Miyashita | ............ | G03F 1/44 356/601 |
| 2011/0173793 A1 * | 7/2011 | Motohara | ............ | G02B 6/4222 29/714 |
| 2021/0063676 A1 * | 3/2021 | Patterson | ............ | G02B 6/3652 |
| 2022/0034750 A1 * | 2/2022 | Myslinski | ............ | G01M 11/333 |
| 2022/0035110 A1 * | 2/2022 | Keck | ............ | G02B 6/4225 |

* cited by examiner

OPTICAL BASED PLACEMENT OF AN OPTICAL COMPONTENT USING A PICK AND PLACE MACHINE

TECHNICAL FIELD

The present disclosure generally relates to optical circuits, and more particularly to optical component placements.

BACKGROUND

Conventional pick and place machines can quickly pick up components and place them on a board (e.g., die, substrate). While conventional pick and place machines can be used to rapidly manufacture circuit structures, they lack mechanisms for optimizing optical component placements.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Figure 1:
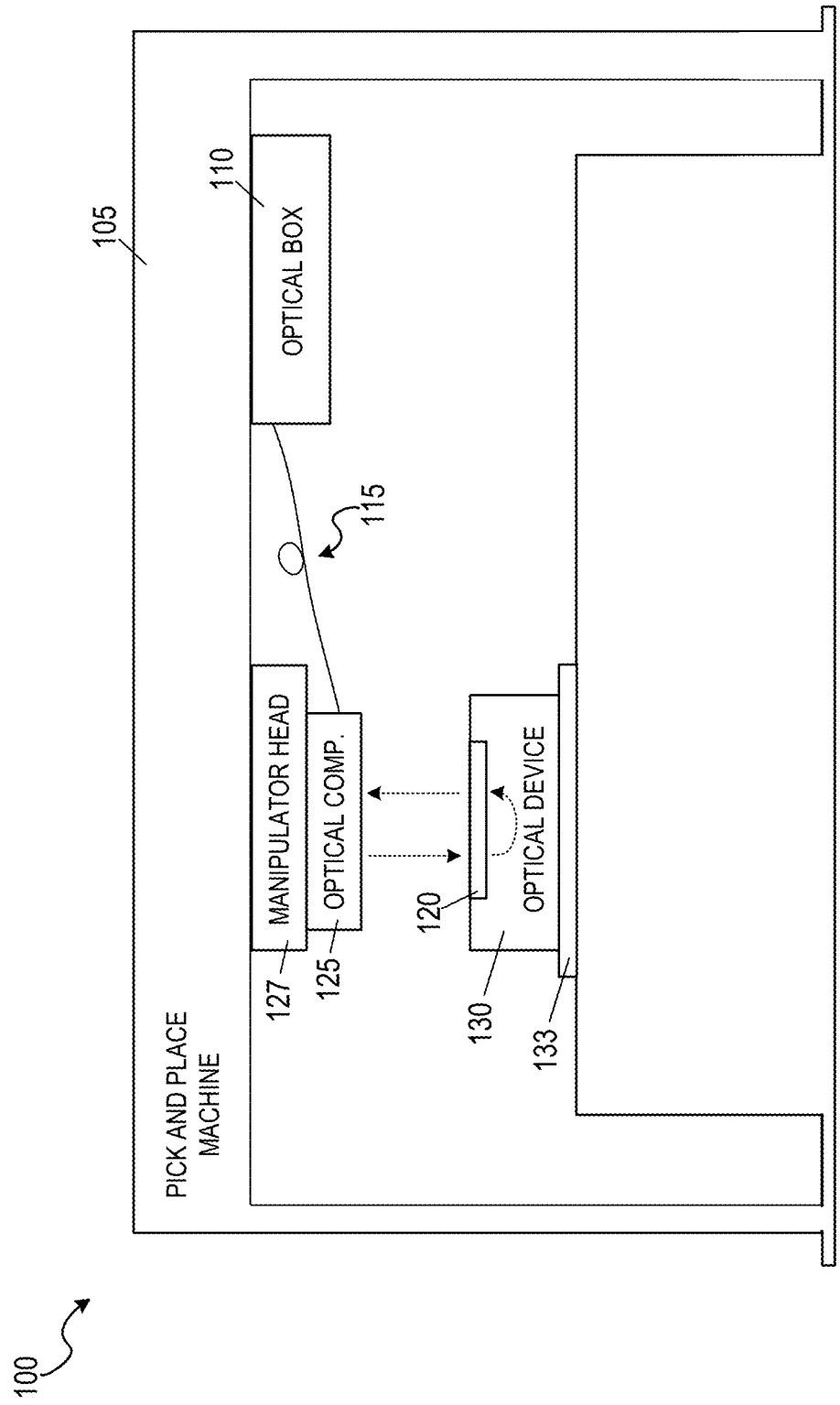
FIG. 1 shows a high level optical pick and place architecture, according to some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

Pick and place machines can be used to manufacture circuit structures. For example, a placement surface (e.g., wafer, substrate, multi-chip module) is placed in a holder of a pick and place machine, and the pick and place machine uses actuating arms and pickers (e.g., a nozzle) to quickly pick up electronic components or place them on the board. Once placed, the components on the board can be held once placed using temporary or permanent pastes (e.g., solder, temporary adhesive, glue). While pick and place machines can rapidly place parts (e.g., place dies, complete a multi-chip module), accuracy is important and the machines can be calibrated beforehand for exact placements of the components. Additionally, some machines use image (e.g., CCD, CMOS camera) systems to ensure accurate placement of the components. These approaches increase accuracy but lack feedback-based optimization for placement of optical components (e.g., lens, fibers, gratings), which can require high-precision to function correctly. For example, some optical components are configured to operate with certain losses, and inaccurate placement of the optical components can cause optical loss (e.g., improper alignment of butt-coupled fibers), which can cause the optical device to not function correctly at operation time. Additionally, some optical devices have operational characteristics (e.g., polarization sensitive PICs) that can further compound the difficult of accurately placing an optical component on the optical device during the manufacturing stage. As such, the pick and place machines (e.g., computer vision based pick and place machine) are not optimized for error-feedback signal based placement of optical components.

To this end, a self-calibrating optical pick and place machine can include an optical placement controller system that is configured to self-calibrate its optical placement system for subsequent placements of optical components using an active alignment process, in which light is coupled between the optical component and optical device on which the optical component is placed. In some example embodiments, the self-calibrating optical pick and place machine has a light source that generates light for active alignment and a photodetector to detect light from the device or the light source in a loopback mode that can be used to generate a baseline value for accurate optical placements.

In the loopback mode, an optical switch couples the light source to the photodetector and the optical placement controller system measures the detected light as a baseline or benchmark data value. To initiate active alignment mode, the optical switch couples the light source to the placement head which directs the light towards the optics device (e.g., board or device upon which the component is being placed). The optical switch further configures the placement head to receive light from the optics device and input the light into the photodetector for measurement. In the active alignment operation, light is injected into the optical device, received by the optical device, and measured by the photodetector to generate a voltage control signal that indicates the optical power level being received from the active alignment loop. The pick and place machine can receive the voltage control signal and use it as a control loop to maximize the optical coupling between the component being placed and the optical device on which the component is placed. For example, the pick and place machine can include instructions to move the optical component being placed in one or more dimensions (e.g., laterally, via one or more rotations) until the highest optical power level is reached (e.g., as indicated by the voltage signal from the photodiode).

Further, in some example embodiments, the optical placement controller can use the baseline value to ensure that the optical component placed via active alignment is within a prespecified range. For example, the pick and place machine can be used to place a plurality of optical components on a plurality of corresponding optical devices using the active alignment process. While the active alignment process can optimize the light value while a given component is being placed, the maximization of light returned may not report a definitive measure of optical loss for a given optical component and device coupling. Additionally, in some example embodiments, the light source generates light at different levels due to various environmental factors or process variations. For example, a given light source may generate light at a certain power level on one day and another power level on another day, which may appear as optical loss from the device itself when in fact the lower light being received is due to the light source, not the component being placed.

To this end, the baseline value can ensure that the optically placed device is not only accurately placed but further ensure that the optical coupling being the optics component and device are within specification. For example, at the beginning of a placement operation the baseline value may be generated and stored. Next an optical component may be placed via active alignment which maximizes the light detected by the photodetector. Further, the optical power level of the placed component is then checked against the stored baseline value to ensure that the measured value is within specification (e.g., within 20% of the baseline value). In this way, the pick and place machine can efficiently place optical components in an approach that ensures accuracy of the placement and further ensures optimized optical coupling that is within specification.

FIG. 1 shows a high level optical pick and place architecture 100, according to some example embodiments. In the example illustrated, an optical pick and place machine 105 is implemented to place an optical component 125 on an optical device 130. In some example embodiments, the pick and place machine 105 is a die or chip bonder pick and place machine that is configured to place electrical components (e.g., dies, chiplets), but is not natively configured for optimized feedback based placement of optical components (e.g., optical connector, coupler, grating, lens, optical head/receptacle). In some example embodiments, an optical box 110 is integrated with the pick and place machine 105 to enable the pick and place machine 105 to efficiently place optical components. The optical box 110 is an optical placement controller system comprising active alignment optical components to accurately place the optical component 125 on the optical device 130. In some example embodiments, the optical box 110 is physically attached to the pick and place machine 105 and is also coupled to the optical component 125 to be placed using an optical connector 115 (e.g., one or more fibers, a ribbon of fibers, fiber connectors (FCs), output connector 455 and input connector 475, FIG. 4 below).

The pick and place machine 105 can releasably pick up the optical component using a manipulator head 127 (e.g., a bond head, nozzle, plastic assembly that can be configured or shaped to attach to the optical component to be placed). The optical device 130 is placed in a pick and place holder 133 and the pick and place machine 105 moves the manipulator head 127 to position the optical component 125 near the optical device 130 to enable optical coupling, and place the optical component 125 using dynamic active alignment based placement. For example, the pick and place machine 105 can actuate the manipulator head 127 until the optical power level of the active alignment process (e.g., as detected by a photodetector) is maximized.

The optical box 110 can include a light source (e.g., a super luminescent light emitting diode (SLED), a laser) to inject light into a port 120 (e.g., grating, lens, fiber cable end) of the optical device 130 and can further include a photodetector (e.g., photodiode, photocell, photoresistor) to measure the light returned by the optical device 130 from port 120. For example, the optical device 130 can be an optical transceiver that does not include a light source (e.g., the optical transceiver does not have an integrated light source, or has one or more embedded light sources, but is in a powered off state during component placement phase of manufacturing). In some example embodiments, the light injected into the optical device 130 is received by the receiver components of the optical device 130 (e.g., optical receiver 214 (FIG. 2), a receiver optical sub-assembly (ROSA)) and propagates through the optical device 130 to the transmit components (e.g. an optical transmitter 212 (FIG. 2), transmitter optical sub-assembly (TOSA)) and back to the photodetector in the optical box 110 (e.g. via propagation through the optical component 125 itself and the optical connector 115). In other example embodiments, the light may be received by the transmitter components and propagates out through the receiver components, or additionally, propagates from a light input port and output from the transmitter and receiver assemblies, as discussed in further detail with reference to FIG. 2.

Figure 2:
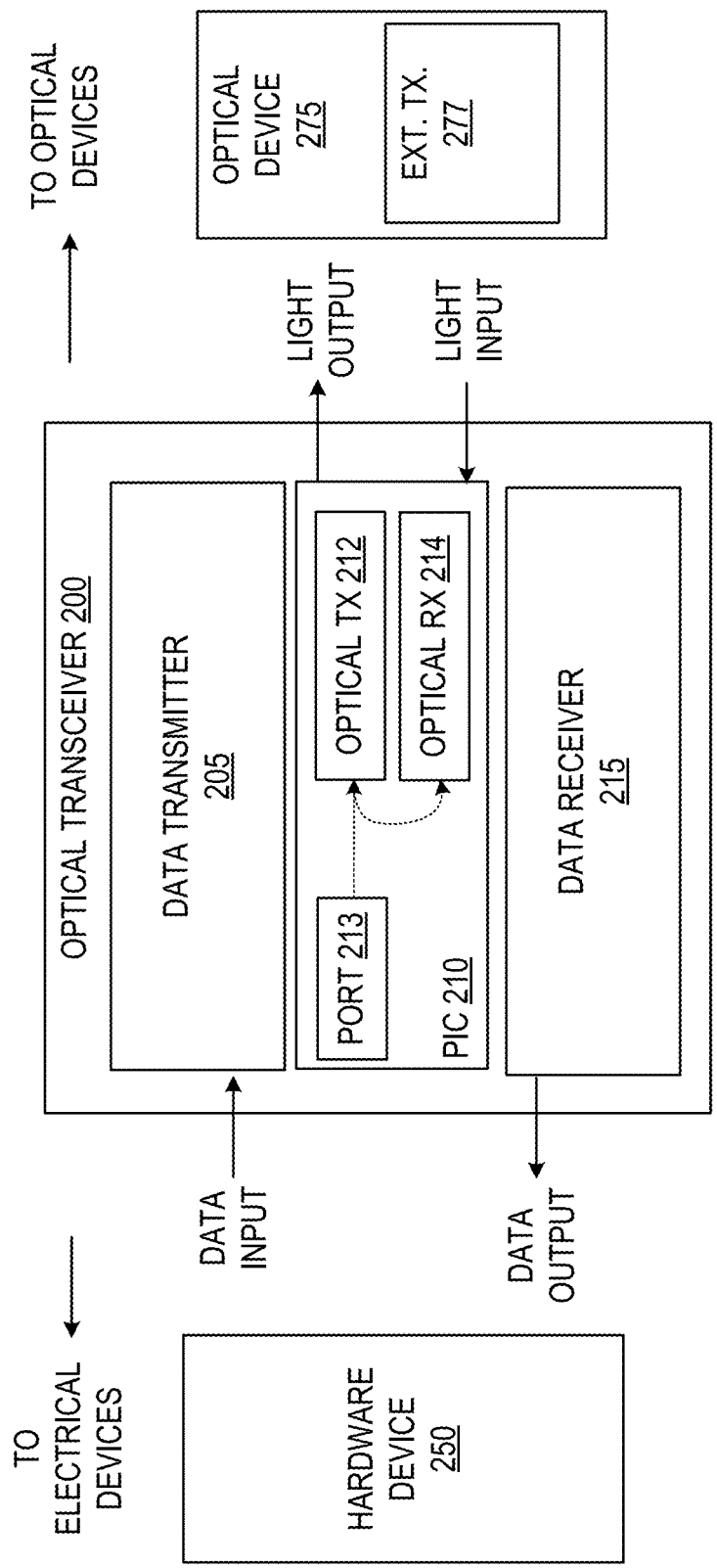
FIG. 2 is a block diagram illustrating an example optical transceiver for transmitting and receiving optical signals, according to some example embodiments.

FIG. 2 is a block diagram illustrating an example optical transceiver 200 for transmitting and receiving optical signals, according to some example embodiments. The optical transceiver 200 is an example of the optical device 130 on which an optical component is to be placed. In the example illustrated in FIG. 2, the optical transceiver 200 processes data from electrical devices, such as electrical hardware device 250, converts the electrical data into optical data, and sends and receives the optical data with one or more optical devices, such as optical device 275. For example, the electrical hardware device 250 can be a host board that "hosts" the optical transceiver 200 as a pluggable device that sends and receives data to an optical switch network; where, for example, optical device 275 can be other components of an optical switch network (e.g., external transmitter 277). However, it is appreciated that the optical transceiver 200 can be implemented to interface with other types of electrical devices and optical devices. For instance, the optical transceiver 200 can be implemented as a single chip on a hybrid "motherboard" that uses an optical network (e.g., waveguides, fibers) as an optical bus to interconnect on-board electrical chips that process the data after it is converted from light into binary electrical data, according to some example embodiments.

In some example embodiments, the hardware device 250 includes an electrical interface for receiving and mating with an electrical interface of the optical transceiver 200. The optical transceiver 200 may be a removable front-end module that may be physically received by and removed from hardware device 250 operating as a backend module within a communication system or device. The optical transceiver 200 and the hardware device 250, for example, can be components of an optical communication device or system (e.g., a network device) such as a wavelength-division multiplexing (WDM) system or a parallel fiber system (e.g., parallel-single fiber (PSM)), according to some example embodiments.

A data transmitter 205 of the optical transceiver 200 can receive the electrical signals, which are then converted into optical signals via the optical transmitter 212 (e.g., modulator, heater) of a photonic integrated circuit (PIC) 210. The PIC 210 can then output the optical signals via optical links, such as fiber or waveguides that interface with the PIC 210. The output light data can then be processed by other components (e.g., switches, endpoint servers, other embedded chips of a single embedded system), via a network such as a wide area network (WAN), optical switch network, optical waveguide network in an embedded system, and others.

In receiver mode, the optical receiver 214 (e.g., photodetector) can receive high data rate optical signals via one or more optical links to optical device 275. The optical signals are converted by the optical receiver 214 from light into electrical signals for further processing by data receiver 215, such as demodulating the data into a lower data rate for output to other devices, such as the electrical hardware device 250. The modulation used by the optical transceiver 200 can include pulse amplitude modulation (e.g., 4-level PAM, such as "PAM4"), quadrature phase-shift keying (QPSK), binary phase-shift keying (BPSK), polarization-multiplexed BPSK, M-ary quadrature amplitude modulation (M-QAM), and others.

In some example embodiments, the light from the optical box 110 is injected and received via an internal loopback path in the PIC 210. For example, the optical transmitter 212 and the optical receiver 214 can be coupled by an integrated waveguide loopback path that can be activated or deactivated (e.g., via semiconductor switch in the PIC). While activated, light from the optical box 110 is injected into the optical receiver 214 and is output by the optical transmitter 212, or vice versa, and then detected by the photodetector in the optical box 110 to generate an optical power level for active alignment based placements of optical components and baseline optical coupling operations.

In some example embodiments, the PIC 210 includes a port 213 (e.g., grating, lens, fiber) for receiving optical light for modulation by the optical transmitter 212. For instance, the optical transceiver 200 does not include a light source and during operation, light is injected into the port 213 and to the optical transmitter 212 which then outputs the light. In accordance with some example embodiments, during the placement operation, the light from the optical box 110 is injected into the port 213 to the optical transmitter 212 and back to the optical box 110 for measurement by the photodetector.

Figure 3A:
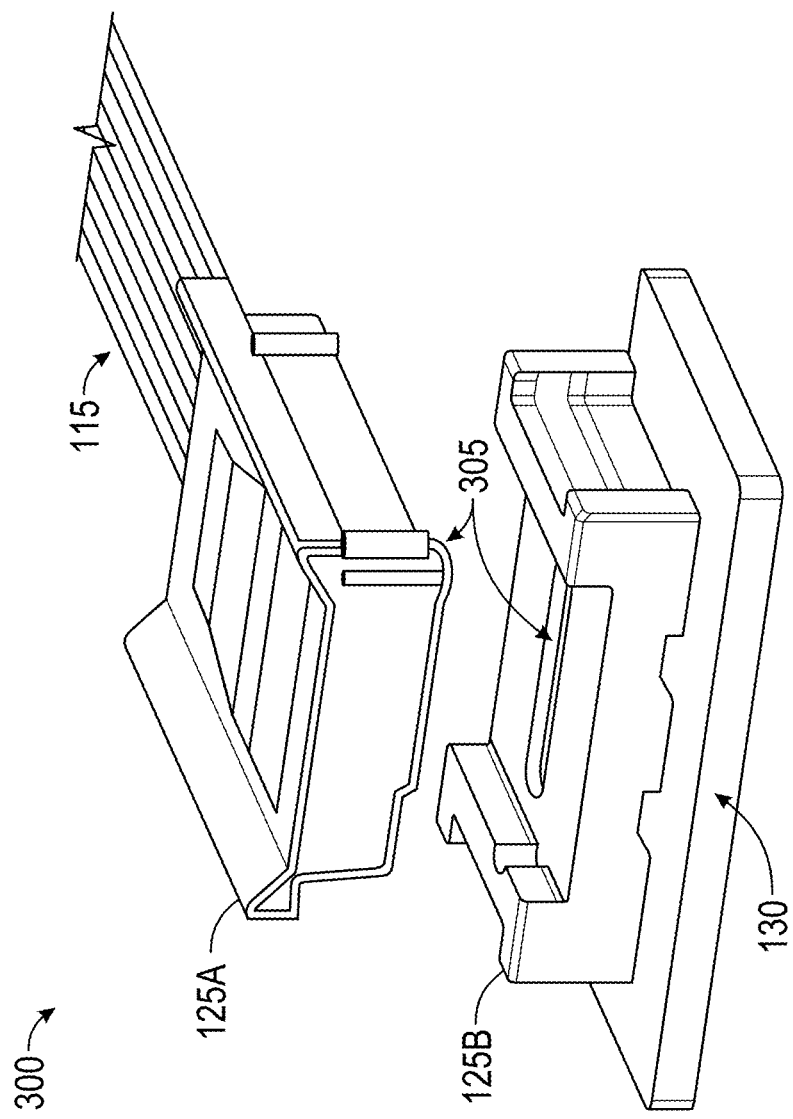
FIG. 3A shows a perspective view of an optical interconnect interface, according to some example embodiments.

FIG. 3A shows a perspective view of an optical interconnect interface 300, according to some example embodiments. The optical interconnect interface 300 is operable to input and output light into the optical device 130 using light from the optical connector 115. In some example embodiments, the optical interconnect interface 300 comprises an optical interconnection head 125A (e.g., plug, ferrule) that attaches to an optical interconnection receptacle 125B. In some example embodiments, the optical component 125 to be placed includes the optical interconnection head 125A and optical interconnection receptacle 125B, where the optical interconnection receptacle 125B is placed using the active alignment process and then epoxied to the optical device 130 for later use (e.g., later connections with the optical interconnection head 125A to receive or transmit light to the optical device 130 during operational use, calibration, testing, or manufacturing processes). In the example illustrated, the optical interconnection head 125A and the optical interconnection receptacle 125B have corresponding alignment features 305 that interlock. For example, the optical interconnections head 125A and optical interconnection receptacle 125B can be interlocked during attachment of the optical interconnection receptacle 125B on the optical device, and then detached from the optical interconnection head 125A. At a later time (e.g., during testing, calibration, or re-calibration of the optical device), the optical interconnection head 125B can interlock with the optical interconnection receptacle 125B for inputting and outputting light to the optical device.

Figure 3B:
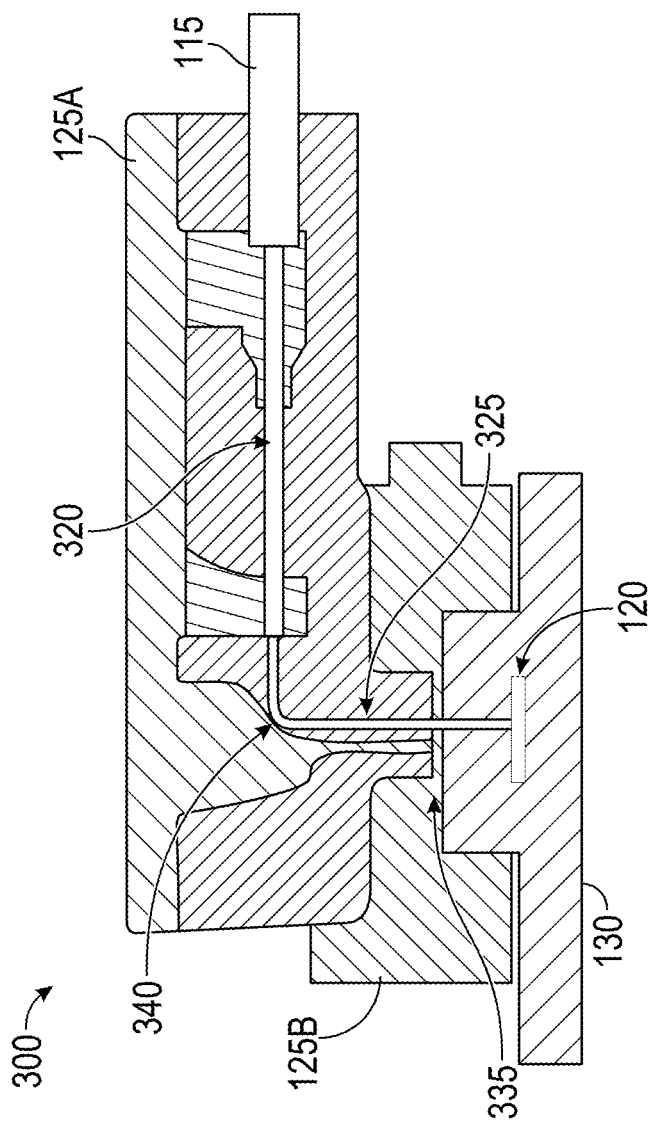
FIG. 3B shows the optical interconnect interface from a side view that illustrates one or more internal components of the optical interconnect interface, according to some example embodiments.

FIG. 3B shows the optical interconnect interface 300 from a side view that illustrates one or more internal components of the optical interconnect interface 300, according to some example embodiments. In the example of FIG. 3B, the optical interconnection head 125A has been interlocked with the optical interconnection receptacle 125B for placement on the optical device 130 using light provided to a port 120 of the optical device 130. In the example illustrated, the optical connections within the optical interconnection head 125A include single mode fibers 320 that transmit light which reflects off a lens 340 towards a beam path 325 (e.g. an internal waveguide, a fiber). The beam path 325 transmits the light towards a one or more lenses 335 (e.g. a micro-lens array) that directs the light towards a port 120 (e.g., grating, lens) of the optical device 130. Further details of the optical interconnection head 125A and optical interconnection receptacle 125B and testing operations are discussed in 4213.129US1, and 4213.118US1, which are hereby incorporated by reference in their entirety. Although FIGS. 3A and 3B display an example of an optical component 125 to be placed using the optical pick and place system, it is appreciated that other types of optical components can likewise be picked and optically placed. The optical component 125 to be placed can include any first optical component (e.g., fiber, lens, optical interconnect head) that can propagate light to and receive light from another second optical component on which the first optical component is to be placed using the active alignment and baseline check operations, according to some example embodiments.

Figure 4:
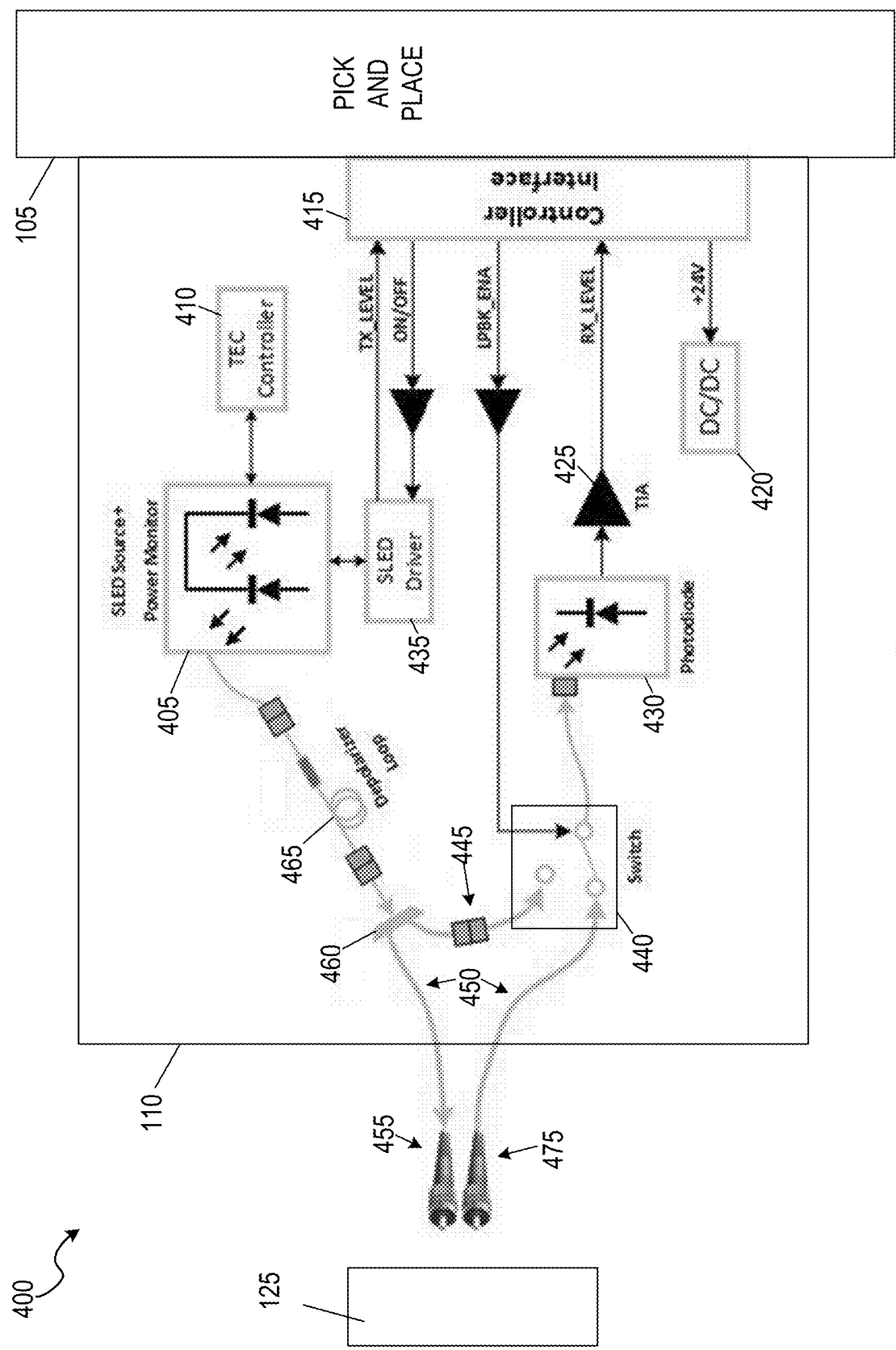
FIG. 4 shows an example architecture of the optical controller box, according to some example embodiments.

FIG. 4 shows an example architecture 400 of the optical box 110, according to some example embodiments. In the example of FIG. 4, the optical box 110 includes a controller interface 415 that electrically interfaces with the pick and place machine 105 for calibrated active alignment based placement of optical components.

A power supply 420 provides power for the optical box components including for example, a light source 405 (e.g., a super luminescent light emitting diode (SLED)), a switch 440 a thermoelectric cooler (TEC) 410, and a light source driver 435. In some example embodiments, light from the light source 405 is guided along the loopback path 445 to the photodetector 430 to generate a baseline value, and the light from the light source 405 is further guided to the active alignment optical pathway 450 for active alignment based placement of the optical component and baseline value checking operations.

In particular, and in accordance with some example embodiments, an optical switch 440 is configured to connect an optical path from the light source 405 to a photodetector 430 (e.g., a photodiode, a phototransistor). To enable the loopback mode, the controller interface 415 issues a loopback control signal to the switch 440 to activate a loopback path 445. The light source 405 then generates light which is depolarized by the depolarizer loop 465, according to some example embodiments in which the optical device 130 is polarization sensitive. For example, the optical device 130 can respond differently to different polarizations which may affect how much light is returned and measured by the photodetector 430. To avoid polarization effects that can cause improper placements and coupling, the depolarizer loop 465 depolarizes the light from the light source 405 to ensure the optical power is evenly split across polarizations when the light reaches the optical device 130.

The depolarized light is then split by power splitter 460 towards a loopback path 445 and the active alignment optical pathway 450. In the loopback mode, the portion of the light from the power splitter 460 propagates via loopback path 445 through the switch 440 to the photodetector 430. The photodetector 430 generates the baseline value which is amplified by a transimpedance amplifier 425 and electrically input into the controller interface 415 for reference in subsequent active alignment based placements of components. In some example embodiments, the baseline value is stored as a data file or value in a database, memory of the pick and place machine 105, and/or in memory of the optical device 130 for reference.

After the baseline value has been generated, the controller interface 415 controls the switch 440 to activate the active alignment optical pathway 450 (e.g., comprising a fiber or silicon waveguide pathway from the light source 405 to the output connector 455, and from the input connector 475 to the switch 440 and photodetector 430). While in active alignment mode, light from the light source 405 is generated and propagates through the depolarizer loop 465 and into the power splitter 460. A portion of the light from the power splitter 460 is coupled to an output connector 455 (e.g., fiber connector). The light at the output connector 455 is then coupled into the optical component 125, and light returned from the optical component 125 (e.g. via the optical device 130) is received by the input connector 475.

The light at the input connector 475 propagates through the switch 440 in the active alignment configuration to the photodetector 430, which is then amplified by the amplifier 425 and provided to the controller interface 415. The pick and place machine 105 receives the signal and actuates the manipulator head 127 to maximize the optical power level of the coupling (e.g., maximizes the light detected by photodetector 430).

In some example embodiments, a baseline coupling evaluation is performed to ensure that the optical power level of the connected component and device is within specification of baseline value. For example, stored instructions (e.g., an optical baseline evaluation algorithm in a microcontroller of the controller interface 415, an optical baseline evaluation algorithm in the pick and place machine 105, an optical baseline evaluation algorithm in an external computer) can determine whether the current optical power level is within specification or range of the baseline value (e.g., within 10%, within 20%). In this way, the component is placed via active alignment in a way that ensures that the optical coupling is within a pre-specified parameter for the given light source, during the given placement time period (e.g., per day). For instance, in some example embodiments, at the start of each data a new baseline value can be generated and referenced during each placement of an optical component on and optical device using active alignment based placement via the pick and place machine 105. In some example embodiments, the baseline value is generated each time, before each active alignment based component is placed, and so on (e.g., hourly, weekly, monthly).

Figure 5:
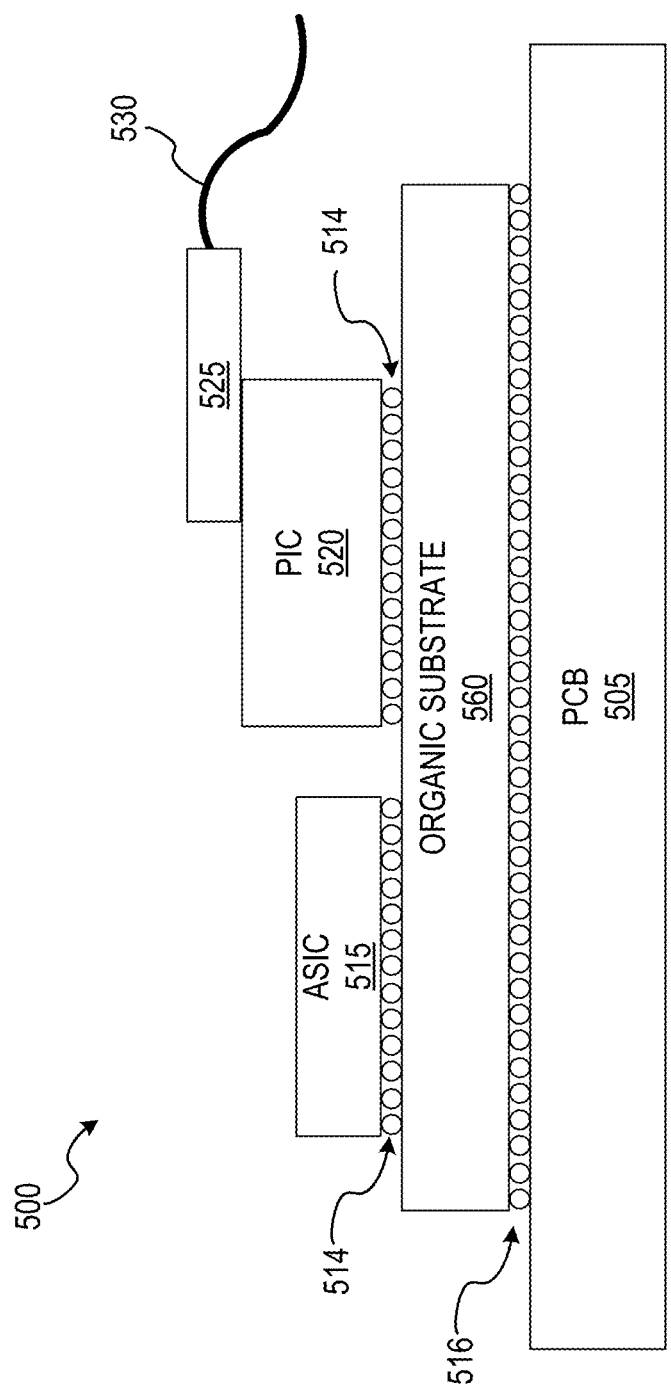
FIG. 5 is an illustration of an optical-electrical device including one or more optical devices, according to an embodiment of the disclosure.

FIG. 5 is an illustration of an optical-electrical device 500 (e.g., optical device 130) including one or more optical devices, according to an embodiment of the disclosure. In this embodiment, the optical-electrical device 500 is a multi-structure chip package that includes a printed circuit board (PCB) substrate 505, organic substrate 560, application specific integrated circuit 515 (ASIC), and photonic integrated circuit (PIC) 520. In this embodiment, the PIC 520 may include one or more optical structures described above (e.g., PIC 210, FIG. 2).

In some example embodiments, the PIC 520 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials may be significantly higher than in silicon-based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as iron, cobalt, or yttrium iron garnet (YIG). Further, in some example embodiments, crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3). In the example illustrated, the PIC 520 exchanges light with fiber 530 via prism 525; said prism 525 is a misalignment-tolerant device used to couple an optical mode to one or more single-mode optical fibers (e.g., to transmit light to and from an optical network), according to some example embodiments.

In some example embodiments, the optical devices of PIC 520 are controlled, at least in part, by control circuitry included in ASIC 515. Both ASIC 515 and PIC 520 are shown to be disposed on copper pillars 514, which are used for communicatively coupling the ICs via organic substrate 560. PCB 505 is coupled to organic substrate 560 via ball grid array (BGA) interconnect 516, and may be used to interconnect the organic substrate 560 (and thus, ASIC 515 and PIC 520) to other components of optical-electrical device 500 not shown, such as interconnection modules, power supplies, and so forth.

Figure 6:
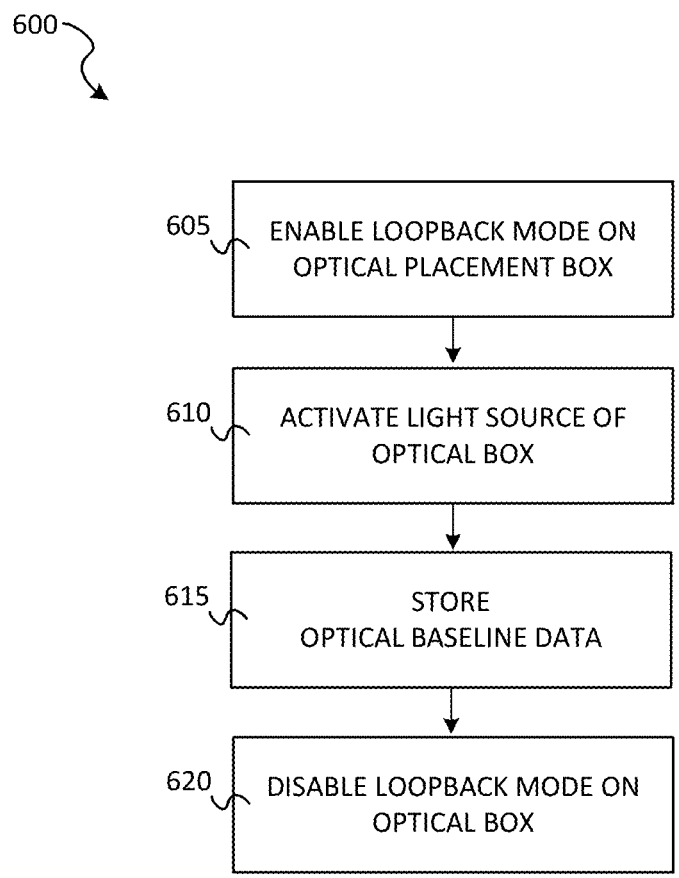
FIG. 6 shows a flow diagram of a method for active alignment calibration of an optical pick and place machine, according to some example embodiments.

FIG. 6 shows a flow diagram of a method 600 for generating an optical baseline value for optical component placement, according to some example embodiments. At operation 605, a loopback mode is enabled on the optical box. For example, the controller interface 415 controls the switch 440 to direct light along the loopback path 445.

At operation 610, a light source is activated on the optical placement box. For example, the controller interface 415 activates the light source 405 (e.g., SLED), which is controlled by the driver 435 and temperature managed by the TEC 410 to stabilize the light output. The light generated by the light source 405 then propagates to the photodetector 430 via the loopback path 445 while in loopback mode.

At operation 615, the optical box stores an optical baseline value. For example, the photodetector 430 measures the light from the light source 405 received via the loopback path 445, which is amplified (e.g., via an amplifier 425) and then stored as the baseline value, according to some example embodiments.

At operation 620, the loopback mode is disabled on the optical box. For example, the controller interface 415 controls the switch 440 to switch from the loopback path 445 to the active alignment optical pathway 450 for active alignment based placement of the optical component. In some example embodiments, the method 600 is performed periodically (e.g., daily) or per every set number of components placed (e.g., per 100 placements) to ensure up to date baseline values and placements. For example, the method 600 can be implemented every day, or every hour, before optical components are placed. During the placement of the optical components, the optical power level of the active alignment placed component can be evaluated against the latest baseline value to ensure that the optical loss is within specification.

Figure 7:
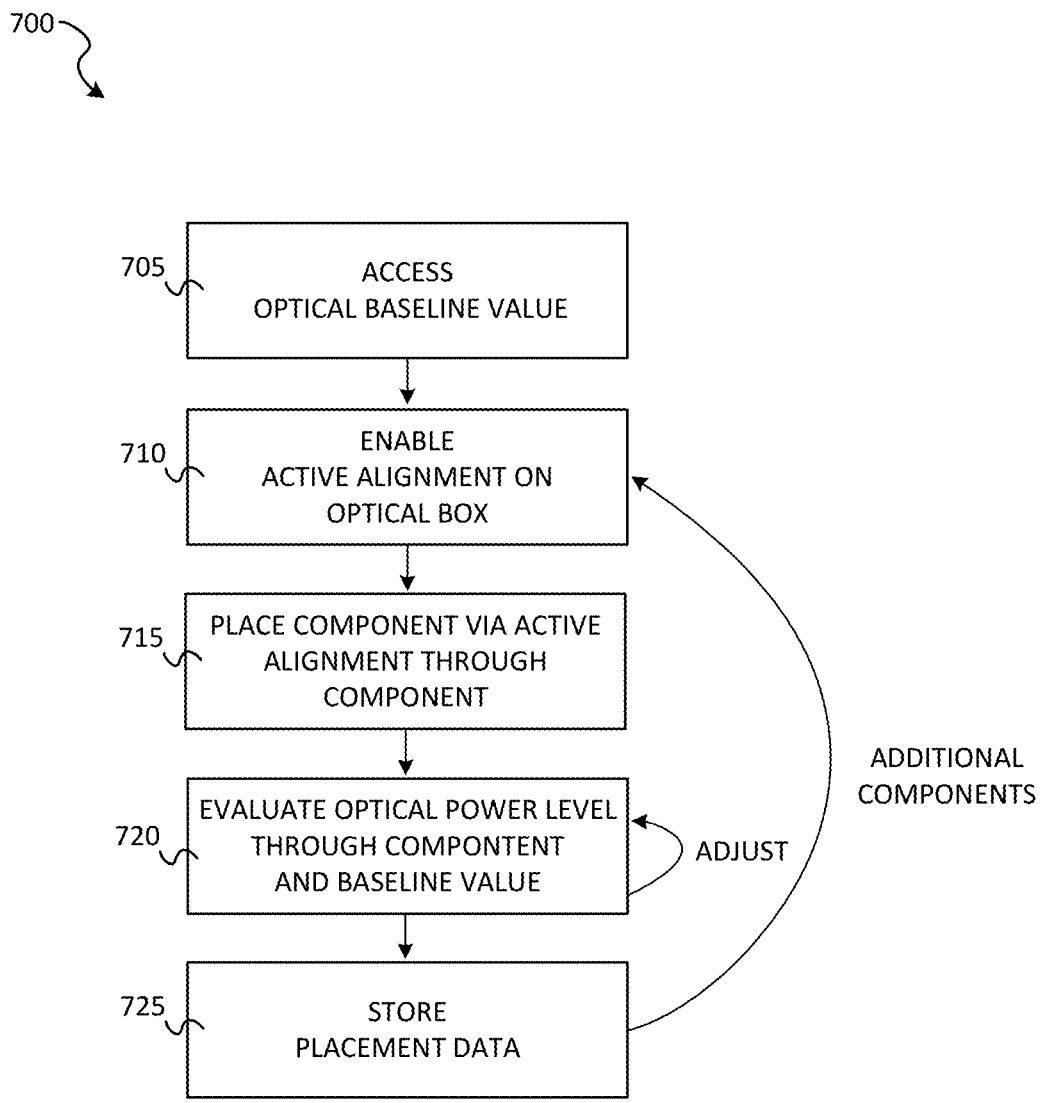
FIG. 7 shows a flow diagram of a method for active alignment of an optical component using a self-calibrated optical pick and place machine, according to some example embodiments.

FIG. 7 shows a flow diagram of a method 700 for active alignment based placements of an optical component using a self-calibrated pick and place machine, according to some example embodiments. The method 700 can be performed after completion of the method 600 in which the baseline or threshold data for the optical box is generated via loopback path and stored for reference. At a high-level, in the active alignment mode, the optical box continuously injects and receives light from the optical device via the optical component and measures the light via a photodetector to generate an optical power level signal, which the pick and place machine then maximizes by actuating the manipulator head (e.g. direction, distance, rotation in different dimensions) until the photodetector generates a highest or maximum value.

At operation 705, the baseline value is accessed. For example, the baseline value generated from method 600 is accessed (e.g., in memory of the optical box 110, the pick and place machine 105, or an external computer or database). At operation 710, active alignment mode is enabled on the optical placement box. For example, the controller interface 415 controls the switch 440 to direct light along the active alignment optical pathway 450. In some example embodiments, the optical box is already configured for active alignment and operation 710 is omitted.

At operation 715, the optical component is placed via active alignment of light through the optical component. For example, light from the light source 405 is coupled to and received from the optical device 130 via the optical component 125. The received light is then measured by the photodetector 430 to generate an optical power level signal which is then optimized by the pick and place machine 125 as discussed above.

In some example embodiments, the optical component 125 is further fixed on the optical device 130. For example, at operation 715 the optical component is placed and attached to the optical device 130 using a temporary adhesive, and additional permanent fixing means (e.g., solder, heat/pressure, epoxy and UV curing) are applied to the bond interface to permanently fix the optical component on the optical device 130.

At operation 720, the optical power level is evaluated against the baseline value. For example, after the optical component 125 is placed on the optical device 130 via active alignment, the current optical power level from the photodetector 430 is evaluated against the stored optical baseline value to ensure it is within specification (e.g., within a prespecified range, 10%, 20%). In some example embodiments, when the optical power level is not within specification, one or more adjustments are performed and the method 700 loops back to 720. For example, if the optical power level is not within specification, one or more adjustments to components in the optical box 110 (e.g., light source 405) or the optical device 130 are made, followed by re-evaluating the optical power level against the baseline value.

At operation 725, placement data is stored. For example, the optical power level as received through the placed component and the baseline value are stored for later reference (e.g., in an external system for certification/analysis of the optical device 130). In some example embodiments, the placement data is not stored and instead the optical component is bonded into place on the optical device (e.g., via epoxy and UV cure, solder, heat/pressure) once the optimal placement is achieved.

In some example embodiments, the method 700 loops to 710 for additional optical component placements. For example, on a given day, a baseline value can be generated and the same baseline value is then used as a reference for a next set of optical components to be placed using the pick and place machine 105 and the optical box 110 using active alignment through the optical component 125 and optical device 130.

A system of one or more computers can be configured to perform particular operations or actions by virtue of having software, firmware, hardware, or a combination of them installed on the system that in operation causes or cause the system to perform the actions. One or more computer applications can be configured to perform particular operations or actions by virtue of including instructions that, when executed by data processing apparatus, cause the apparatus to perform the actions. One general aspect includes a method for placing an optical component using a pick and place machine. The method can also include generating, using a photodetector of an optical placement control circuit structure that is electrically connected to the pick and place machine, a baseline light value while the optical placement control circuit structure is in a loopback mode in which a light source of the optical placement control circuit structure couples light to the photodetector via a loopback optical pathway in the optical placement control circuit structure; storing the baseline light value in memory accessible to the optical placement control circuit structure, configuring the optical placement control circuit structure in an active alignment mode for placement of the optical component on an optical device using light generated by the light source, actuating a manipulator head that is releasably attached to the optical component to optically couple the optical component to the optical device such that light from the light source is input by the optical component into the optical device and light returned by the optical device is received by the optical component and measured as an optical power level by the photodetector of the optical placement control circuit structure, adjusting placement of the optical component by actuating the manipulator head to optimize the optical power level generated by the photodetector, determining that the optical power level is within a prespecified range of the baseline light value, and placing the optical component on the optical device. Other embodiments of this aspect include corresponding computer systems, apparatus, and computer programs recorded on one or more computer storage devices, each configured to perform the actions of the methods.

Implementations may include one or more of the following features: The method where placing the optical component on the optical device attaches the optical component on the optical device using an adhesive. The optical placement control circuit structure may include an optical switch that configures the optical placement control circuit structure in the loopback mode or the active alignment mode. The optical placement control circuit structure may include an active alignment optical pathway may include an input pathway and an output pathway for coupling to the optical device and optical component. The optical placement control circuit structure is configured in the loopback mode by switching, using the optical switch, from the active alignment optical pathway to the loopback optical pathway. The optical placement control circuit structure is further configured in the loopback mode by activating the light source to couple light to the photodetector via the loopback optical pathway. The optical placement control circuit structure is configured in the active alignment mode by switching, using the optical switch, from the loopback optical pathway to the active alignment optical pathway. The optical placement control circuit structure is further configured in the active alignment mode by activating the light source to couple light to the optical device and receive the light from the optical device using the active alignment optical pathway. The method may include releasing the optical component using the manipulator head. The manipulator head includes a nozzle to releasably pick up the optical component. The pick and place machine optimizes the optical power level by actuating the manipulator head to maximize the optical power level that is generated by the photodetector while in active alignment mode. The pick and place machine may include one or more robotic arms for actuating the manipulator head in one or more directions. Implementations of the described techniques may include hardware, a method or process, or computer software on a computer-accessible medium.

One general aspect includes an optical pick and place machine for placing an optical component. The optical pick also includes a manipulator head that is releasably attached to the optical component to pick up and place the optical component on an optical device using active alignment based placement; and an optical placement control circuit structure may include a light source, a photodetector, and an optical switch, the optical switch to configure the optical placement control circuit structure in a loopback mode in which light propagates from the light source to the photodetector to generate a baseline light value, the optical switch to further configure the optical placement control circuit structure in active alignment mode that couples light from the light source into the optical device and receive light returned by the optical device to generate an optical power level using the photodetector. Other embodiments of this aspect include corresponding computer systems, apparatus, and computer programs recorded on one or more computer storage devices, each configured to perform the actions of the methods.

Implementations may include one or more of the following features. The optical pick and place machine where the optical component is placed on the optical device and attached to the optical device using an adhesive. The optical power level generated by the photodetector after the optical device is placed on the optical device is evaluated against the baseline light value and determined to be within a prespecified range of the baseline light value. The optical placement control circuit structure is further configured in the loopback mode by activating the light source to couple light to the photodetector via a loopback optical pathway. The optical placement control circuit structure is configured in the active alignment mode by switching, using the optical switch, from a loopback optical pathway to an active alignment optical pathway. The optical placement control circuit structure is further configured in the active alignment mode by activating the light source to couple light to the optical device and receive the light from the optical device using the active alignment optical pathway. The manipulator head includes a nozzle to releasably pick up the optical component. The optical device is an optical transceiver with an optical port to input and output light. Implementations of the described techniques may include hardware, a method or process, or computer software on a computer-accessible medium.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method for placing an optical component using a pick and place machine, the method comprising:
generating, using a photodetector of an optical placement control circuit structure that is electrically connected to the pick and place machine, a baseline light value while the optical placement control circuit structure is in a loopback mode in which a light source of the optical placement control circuit structure couples light to the photodetector via a loopback optical pathway in the optical placement control circuit structure;
storing the baseline light value in memory accessible to the optical placement control circuit structure;
configuring the optical placement control circuit structure in an active alignment mode for placement of the optical component on an optical device using light generated by the light source;
actuating a manipulator head that is releasably attached to the optical component to optically couple the optical component to the optical device such that light from the light source is input by the optical component into the optical device and light returned by the optical device is received by the optical component and measured as an optical power level by the photodetector of the optical placement control circuit structure;

adjusting placement of the optical component by actuating the manipulator head to optimize the optical power level generated by the photodetector;
determining that the optical power level is within a prespecified range of the baseline light value; and
placing the optical component on the optical device.

2. The method of claim 1, wherein placing the optical component on the optical device attaches the optical component on the optical device using an adhesive.

3. The method of claim 1, wherein the optical placement control circuit structure comprises an optical switch that configures the optical placement control circuit structure in the loopback mode or the active alignment mode.

4. The method of claim 3, wherein the optical placement control circuit structure comprises an active alignment optical pathway comprising an input pathway and an output pathway for coupling to the optical device and optical component.

5. The method of claim 4, wherein the optical placement control circuit structure is configured in the loopback mode by switching, using the optical switch, from the active alignment optical pathway to the loopback optical pathway.

6. The method of claim 5, wherein the optical placement control circuit structure is further configured in the loopback mode by activating the light source to couple light to the photodetector via the loopback optical pathway.

7. The method of claim 4, wherein the optical placement control circuit structure is configured in the active alignment mode by switching, using the optical switch, from the loopback optical pathway to the active alignment optical pathway.

8. The method of claim 7, wherein the optical placement control circuit structure is further configured in the active alignment mode by activating the light source to couple light to the optical device and receive the light from the optical device using the active alignment optical pathway.

9. The method of claim 1, further comprising:
releasing the optical component using the manipulator head.

10. The method of claim 9, wherein the manipulator head includes a nozzle to releasably pick up the optical component.

11. The method of claim 1, wherein the pick and place machine optimizes the optical power level by actuating the manipulator head to maximize the optical power level that is generated by the photodetector while in active alignment mode.

12. The method of claim 1, wherein the pick and place machine comprises one or more robotic arms for actuating the manipulator head in one or more directions.

13. An optical pick and place machine for placing an optical component, the optical pick and place machine comprising:
a manipulator head that is releasably attached to the optical component to pick up and place the optical component on an optical device using active alignment based placement; and
an optical placement control circuit structure comprising a light source, a photodetector, and an optical switch, the optical switch to configure the optical placement control circuit structure in a loopback mode in which light propagates from the light source to the photodetector to generate a baseline light value, the optical switch to further configure the optical placement control circuit structure in active alignment mode that couples light from the light source into the optical device and receive light returned by the optical device to generate an optical power level using the photodetector.

14. The optical pick and place machine of claim 13, wherein the optical component is placed on the optical device and attached to the optical device using an adhesive.

15. The optical pick and place machine of claim 13, wherein the optical power level generated by the photodetector after the optical device is placed on the optical device is evaluated against the baseline light value and determined to be within a prespecified range of the baseline light value.

16. The optical pick and place machine of claim 13, wherein the optical placement control circuit structure is further configured in the loopback mode by activating the light source to couple light to the photodetector via a loopback optical pathway.

17. The optical pick and place machine of claim 13, wherein the optical placement control circuit structure is configured in the active alignment mode by switching, using the optical switch, from a loopback optical pathway to an active alignment optical pathway.

18. The optical pick and place machine of claim 17, wherein the optical placement control circuit structure is further configured in the active alignment mode by activating the light source to couple light to the optical device and receive the light from the optical device using the active alignment optical pathway.

19. The optical pick and place machine of claim 13, wherein the manipulator head includes a nozzle to releasably pick up the optical component.

20. The optical pick and place machine of claim 13, wherein the optical device is an optical transceiver with an optical port to input and output light.

* * * * *